United States Patent
Hsu et al.

(10) Patent No.: US 9,602,104 B2
(45) Date of Patent: Mar. 21, 2017

(54) OUTPUT BUFFER WITH OFFSET CANCELLATION STRUCTURE AND OFFSET CANCELLATION METHOD USING THE SAME

(71) Applicant: Sitronix Technology Corp., Hsinchu County (TW)

(72) Inventors: Ming-Wei Hsu, Hsinchu County (TW); Chern-Lin Chen, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 184 days.

(21) Appl. No.: 14/642,779

(22) Filed: Mar. 10, 2015

(65) Prior Publication Data

US 2016/0269027 A1 Sep. 15, 2016

(51) Int. Cl.
  *H03K 19/00* (2006.01)
  *H03F 3/30* (2006.01)
  *H03F 3/45* (2006.01)
  *G09G 3/36* (2006.01)

(52) U.S. Cl.
  CPC ....... *H03K 19/0027* (2013.01); *G09G 3/3688* (2013.01); *H03F 3/3022* (2013.01); *H03F 3/3023* (2013.01); *H03F 3/45183* (2013.01); *H03F 3/45192* (2013.01); *H03F 3/45246* (2013.01); *H03F 3/45475* (2013.01); *H03F 3/45744* (2013.01); *H03F 3/45968* (2013.01); *G09G 2310/0291* (2013.01); *H03F 2203/45212* (2013.01)

(58) Field of Classification Search
  CPC .................................................. H03K 19/0027
  See application file for complete search history.

(56) References Cited

U.S. PATENT DOCUMENTS 6,762,643 B2 * 7/2004 Milanesi ............. H03F 3/45183
                                                                 327/307

* cited by examiner

*Primary Examiner* — Hai L Nguyen
(74) *Attorney, Agent, or Firm* — Winston Hsu; Scott Margo

(57) ABSTRACT

An output buffer with an offset cancellation structure for an LCD source driver includes an operational amplifier, for driving an output signal of the output buffer according to a data signal from a data input terminal of the output buffer; a reference voltage generator, for generating a reference voltage and inputting the reference voltage to the operational amplifier; and a sampling capacitor, coupled between a second input terminal of the operational amplifier and the data input terminal of the output buffer in a first phase, and coupled between the second input terminal of the operational amplifier and an output terminal of the operational amplifier in a second phase, wherein the second input terminal of the operational amplifier is further coupled to the output terminal of the operational amplifier in the first phase. The output signal outputs the data signal where the offset voltage is cancelled in the second phase.

12 Claims, 11 Drawing Sheets

OUTPUT BUFFER WITH OFFSET CANCELLATION STRUCTURE AND OFFSET CANCELLATION METHOD USING THE SAME

BACKGROUND OF THE INVENTION

1. Field of the Invention

The present invention relates to an output buffer with an offset cancellation structure and an offset cancellation method for a liquid crystal display (LCD) source driver, and more particularly, to an output buffer with an offset cancellation structure and an offset cancellation method for an LCD source driver having a benefit of less transistor count.

2. Description of the Prior Art

A liquid crystal display (LCD) source driver is utilized for outputting voltages to an LCD panel according to pixel data required to be displayed. In order to drive pixel units on the LCD panel, an output buffer is always implemented in an output terminal of each channel of the source driver. The output buffer should be able to drive the pixel units with a wide range of gray scale or brightness, and thereby includes an operational amplifier having high loop gain and high slew rate. More importantly, the operational amplifier should have a rail-to-rail input and rail-to-rail output structure, to be adapted to a wide range of pixel data, which may extend from the ground voltage to the power supply voltage of the output buffer.

However, most operational amplifiers have offset between input terminals; that is, there may be a slight voltage difference between the operational amplifier's positive input terminal and negative input terminal; this offset causes an error in the pixel data outputted by the output buffer.

Several offset cancellation techniques have been disclosed. One of the common offset cancellation techniques is chopper circuit. Please refer to FIG. 1A and FIG. 1B, which are schematic diagrams of an output buffer 10 using the chopper offset cancellation technique. As shown in FIGS. 1A and 1B, the output buffer 10 includes a closed loop operational amplifier 100, where the pixel data signal V_DATA is inputted to an input terminal of the operational amplifier 100, and another input terminal is connected to the output terminal of the operational amplifier 100, to form the closed loop structure. There is an offset voltage V_OS between input terminals of the operational amplifier 100, as illustrated to be a voltage source coupled to the positive input terminal of the operational amplifier 100. The chopper circuit applies two phases to average out the offset voltage V_OS. A switch module 102 is applied to switch the output buffer 10 between the two phases, one of which is illustrated in FIG. 1A and the other is illustrated in FIG. 1B.

In FIG. 1A, the pixel data signal V_DATA is inputted to the positive input terminal of the operational amplifier 100, and the negative input terminal of the operational amplifier 100 is coupled to the output terminal. In this case with consideration of the offset voltage V_OS, the output signal of the operational amplifier 100 will be equal to V_DATA plus V_OS. In FIG. 1B, the pixel data signal V_DATA is inputted to the negative input terminal of the operational amplifier 100, and the positive input terminal of the operational amplifier 100 is coupled to the output terminal. In this case with consideration of the offset voltage V_OS, the output signal of the operational amplifier 100 will be equal to V_DATA minus V_OS. If the switch module 102 keeps switching between the two phases, the output signal of the operational amplifier 100 may be continuously switched between V_DATA+V_OS and V_DATA−V_OS. In such a condition, the long-term average of the output signal will be V_DATA, and the offset voltage V_OS is cancelled.

Furthermore, FIG. 2 illustrates the structure of the operational amplifier 100. In order to be adapted to a wide range of pixel data, the operational amplifier 100 should have rail-to-rail input and rail-to-rail output structure. For the realization of rail-to-rail input, the operational amplifier 100 includes two input stages, one of which has a differential pair of NMOS transistors and the other has a differential pair of PMOS transistors. In both differential pairs, the gate terminals of transistors receive input signals V_IP and V_IN from the positive and negative input terminals, respectively. The operational amplifier 100 is controlled by bias voltages V_BP1, V_BP2, V_BP3, V_BN1, V_BN2 and V_BN3, and outputs an output signal V_OUT. In addition, since the output buffer 10 is switched between two phases, the operational amplifier 100 should be switched accordingly and there are 12 switches deployed in the operational amplifier 100. In such a condition, the operational amplifier 100 requires 20 transistors for rail-to-rail structure and high driving capability, as well as 24 transistors for the 12 switches. There are 44 transistors in the operational amplifier 100. In consideration of 44 transistors in the operational amplifier 100 and 8 transistors for the 4 chopper switches in the switch module 102 (as shown in FIGS. 1A and 1B), the output buffer 10 using the chopper offset cancellation technique totally requires 52 transistors, which occupies a significant area in the source driver.

In order to reduce the transistor count, other offset cancellation techniques are proposed, e.g., the auto-zero technique. However, the performance of transistor reduction may still be unsatisfactory. Thus, there is a need for providing a more preferable offset cancellation circuit to further reduce the transistor count in the output buffer of the LCD source driver.

SUMMARY OF THE INVENTION

It is therefore an object of the present invention to provide an output buffer with an offset cancellation structure and an offset cancellation method for a liquid crystal display (LCD) source driver. The output buffer and the offset cancellation method are capable of omitting the usage of rail-to-rail input structure in the operational amplifier, in order to achieve preferable reduction of transistor count.

The present invention discloses an output buffer with an offset cancellation structure for an LCD source driver. The output buffer comprises an operational amplifier, for driving an output signal of the output buffer according to a data signal from a data input terminal of the output buffer; a reference voltage generator, coupled to a first input terminal of the operational amplifier, for generating a reference voltage and inputting the reference voltage to the operational amplifier; and a sampling capacitor, coupled between a second input terminal of the operational amplifier and the data input terminal of the output buffer in a first phase, and coupled between the second input terminal of the operational amplifier and an output terminal of the operational amplifier in a second phase, wherein the second input terminal of the operational amplifier is further coupled to the output terminal of the operational amplifier in the first phase. The output signal outputs the reference voltage with an offset voltage in the first phase and outputs the data signal where the offset voltage is cancelled in the second phase.

The present invention further discloses an offset cancellation method for an LCD source driver. The offset cancellation method comprises inputting a reference voltage to a first input terminal of the operational amplifier; coupling a second input terminal of the operational amplifier to a first terminal of a sampling capacitor; in a first phase, further coupling the second input terminal of the operational amplifier to an output terminal of the operational amplifier and inputting a data signal to a second terminal of the sampling capacitor; and in a second phase, coupling the second terminal of the sampling capacitor to the output terminal of the operational amplifier, to output an output signal in the output terminal of the operational amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
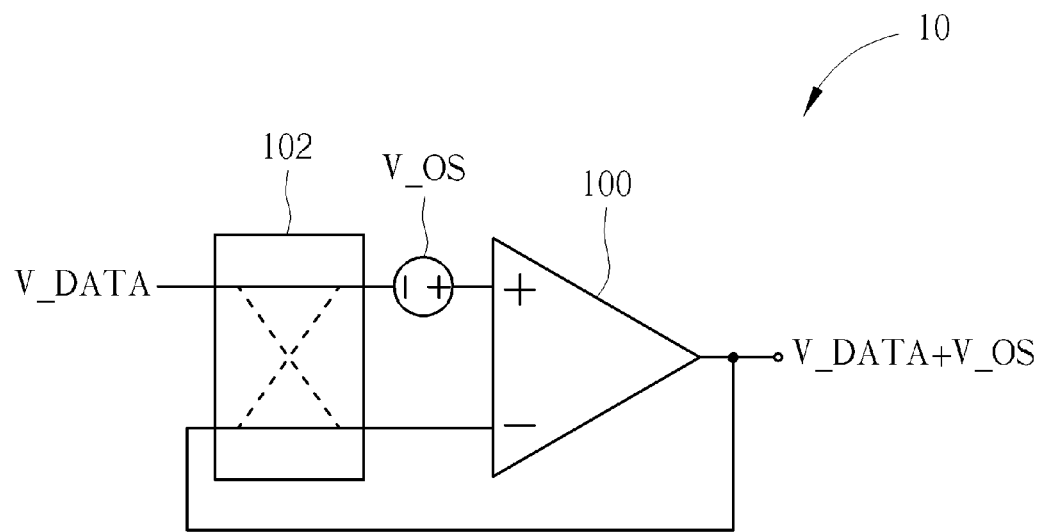
FIG. 1A and FIG. 1B are schematic diagrams of an output buffer using the chopper offset cancellation technique.
Figure 1B:
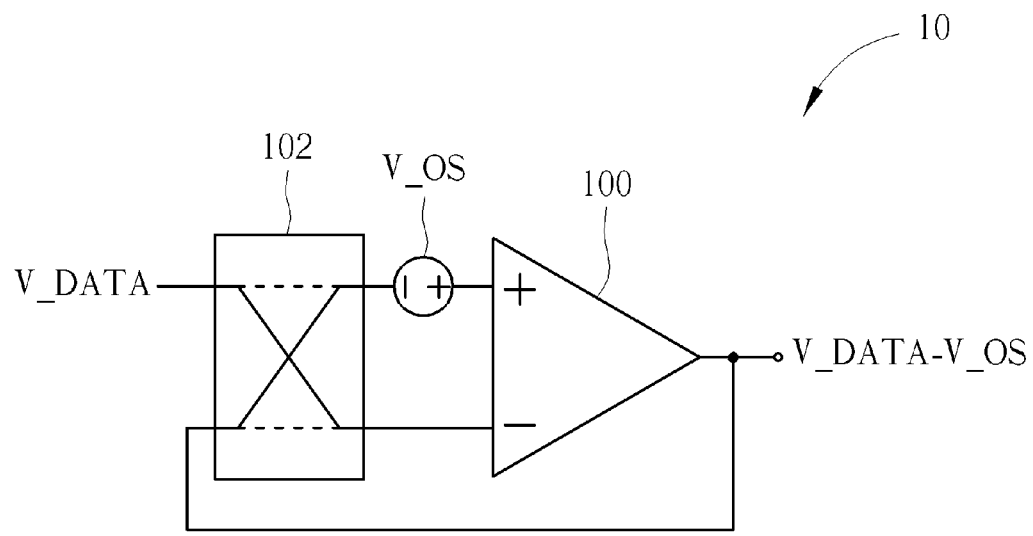
Figure 2:
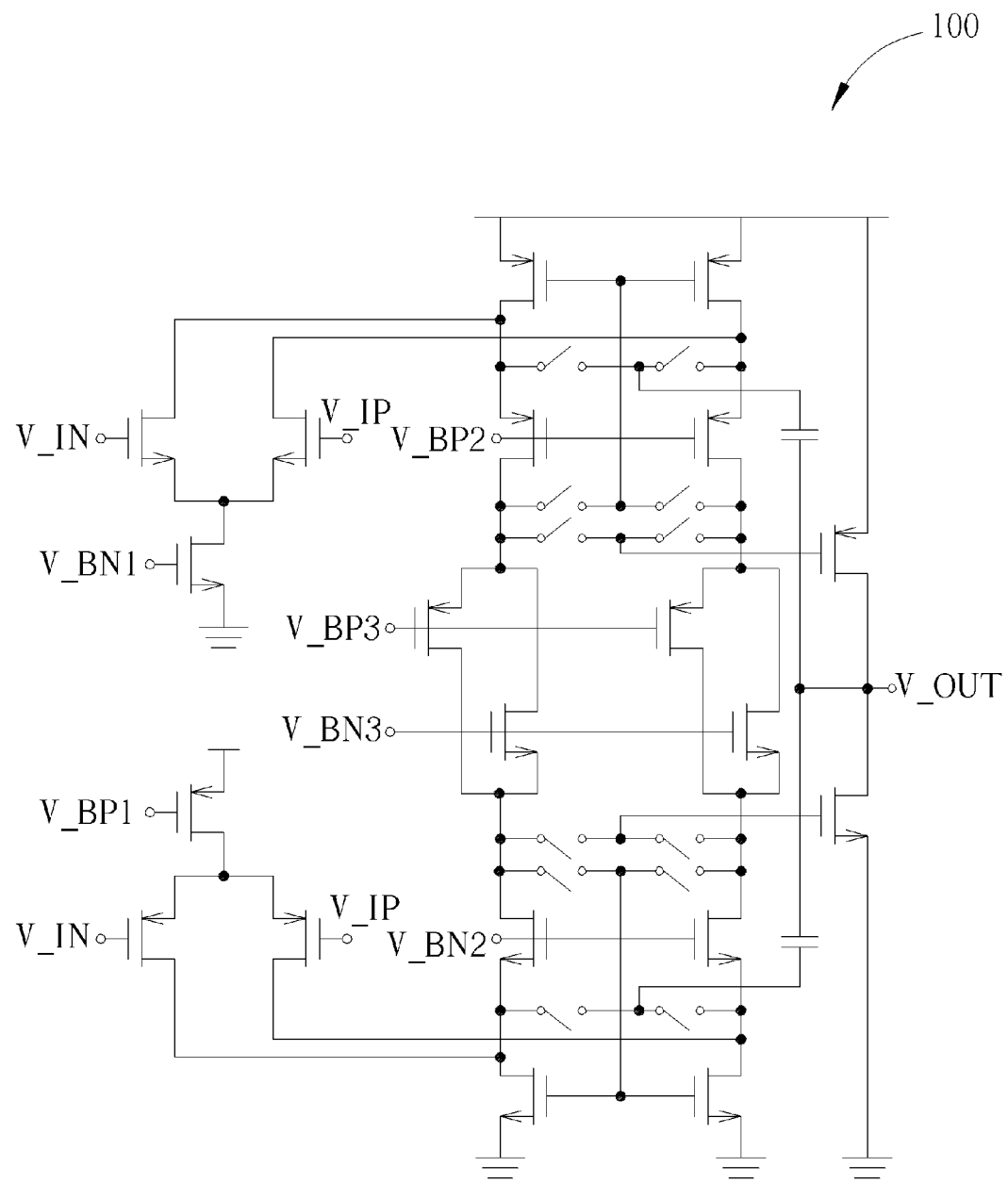
FIG. 2 illustrates the structure of the operational amplifier shown in FIGS. 1A and 1B.
Figure 3A:
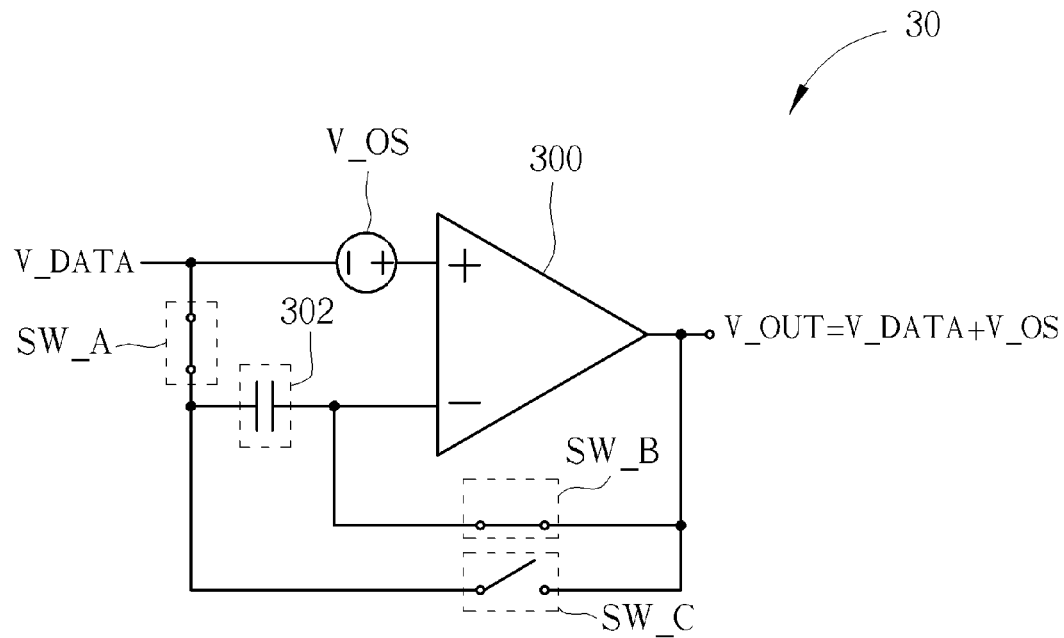
FIG. 3A and FIG. 3B are schematic diagrams of an output buffer using the auto-zero offset cancellation technique.
Figure 3B:
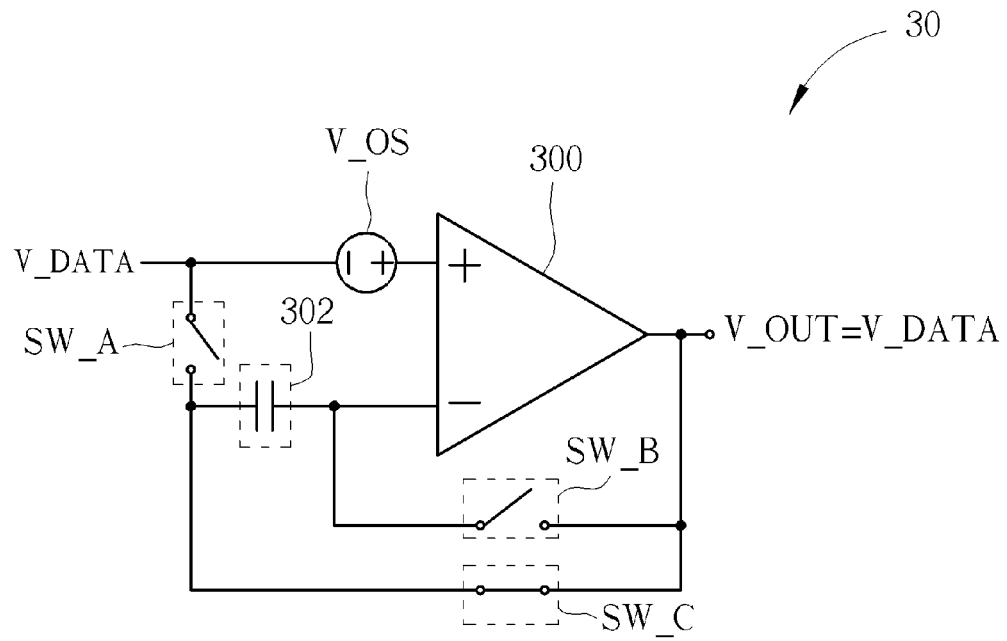

Please refer to FIG. 3A and FIG. 3B, which are schematic diagrams of an output buffer 30 using the auto-zero offset cancellation technique. As shown in FIGS. 3A and 3B, the output buffer 30 includes an operational amplifier (hereinafter abbreviated as "op amp") 300, a sampling capacitor 302 and switches SW_A, SW_B and SW_C. The op amp 300 is utilized for driving an output signal V_OUT of the output buffer 30 according to a data signal V_DATA from a data input terminal of the output buffer 30. The data input terminal is coupled to the positive input terminal of the op amp 300. The sampling capacitor 302 is coupled to the negative input terminal of the op amp 300, to sample an offset voltage V_OS and cancel the offset voltage V_OS, where the offset voltage V_OS is illustrated as a voltage source coupled to the positive input terminal of the op amp 300. The auto-zero offset cancellation circuit applies two phases, including a sample phase and an output phase, to cancel the offset voltage V_OS. The switches SW_A, SW_B and SW_C are deployed to switch the output buffer 30 between the sample phase and the output phase, as illustrated in FIGS. 3A and 3B, respectively.

FIG. 3A illustrates the sample phase, in which the offset voltage V_OS is sampled by the sampling capacitor 302. After the offset voltage V_OS is sampled, the voltage difference between two terminals of the sampling capacitor 302 may be equal to the offset voltage V_OS and this voltage difference is stored in the sampling capacitor 302. As shown in FIG. 3A, the output terminal of the op amp 300 is coupled to the negative input terminal of the op amp 300, so the output signal V_OUT will be equal to the data signal V_DATA with the offset voltage V_OS; that is, V_DATA+V_OS. In this case, the switch SW_A is closed to couple the negative terminal of the sampling capacitor 302 with the data input terminal, the switch SW_B is closed to couple the positive terminal of the sampling capacitor 302 (i.e., the negative input terminal of the op amp 300) with the output terminal of the op amp 300, and the SW_C is open.

FIG. 3B illustrates the output phase, in which the output buffer 30 may output the data signal where the offset voltage V_OS is cancelled. As shown in FIG. 3B, the output terminal of the op amp 300 is coupled to the negative terminal of the sampling capacitor 302, where the offset voltage is deducted due to the voltage difference stored by the sampling capacitor 302 in the sampling phase. Therefore, the output signal V_OUT will be equal to the data signal V_DATA without the offset voltage V_OS. In this case, the switch SW_A is open, the switch SW_B is open, and the switch SW_C is closed to couple the output terminal of the op amp 300 (i.e., the output terminal of the output buffer 30) with the negative terminal of the sampling capacitor 302.

Figure 4:
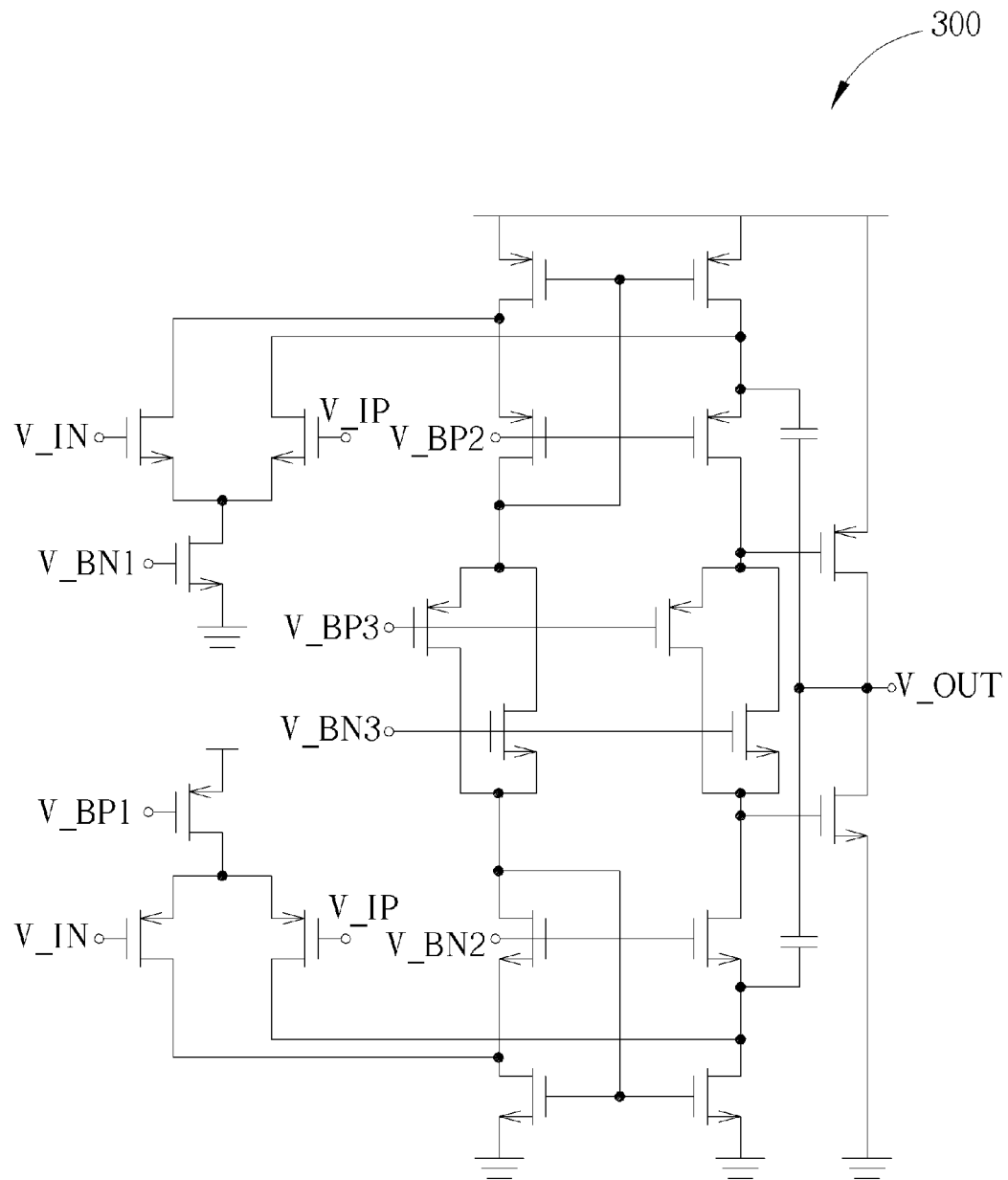
FIG. 4 illustrates the structure of the operational amplifier shown in FIGS. 3A and 3B.

Furthermore, FIG. 4 illustrates the structure of the operational amplifier 300. In order to be adapted to a wide range of pixel data, the operational amplifier 100 should have rail-to-rail input and rail-to-rail output structure. Note that the data signal V_DATA stands for the pixel data required to be displayed on the liquid crystal display (LCD), so it may range from the ground voltage to the power supply voltage of the output buffer 30, in order to be adapted to the wide range of pixel data (e.g., the brightness or gray scale of the pixel). Since the positive input terminal of the op amp 300 is coupled to the data input terminal to receive the wide range data signal V_DATA, the op amp 300 should have the rail-to-rail input structure. In addition, since the output signal V_OUT in the output terminal of the op amp 300 is equal to the wide range data signal V_DATA, the rail-to-rail output structure is also required. In such a condition, the structure of the op amp 300 is similar to the structure of the op amp 100 except the switches of the op amp 100; hence, circuit elements or signals with similar functions are denoted by the same symbols. Similarly, the op amp 300 also requires 20 transistors for rail-to-rail structure and high driving capability. In consideration of 20 transistors in the op amp 300 and 6 transistors for the 3 switches in the auto-zero output buffer 30 (i.e., SW_A, SW_B and SW_C), the output buffer 30 using the auto-zero offset cancellation technique totally requires 26 transistors. Note that the sampling capacitor 302 is implemented with the metal-insulator-metal (MIM) capacitor, which is always realized on the metal layers without occupying circuit areas in the diffusion and poly layers; hence, the sampling capacitor 302 may not need to be considered when calculating the circuit areas. Further note that the switches in the output buffers 10 and 30 should be transmission gates, in order to transmit the wide range voltages and signals. In such a condition, each switch may be implemented with a transmission gate and have two transistors (i.e., an NMOS transistor and a PMOS transistor).

Figure 5A:
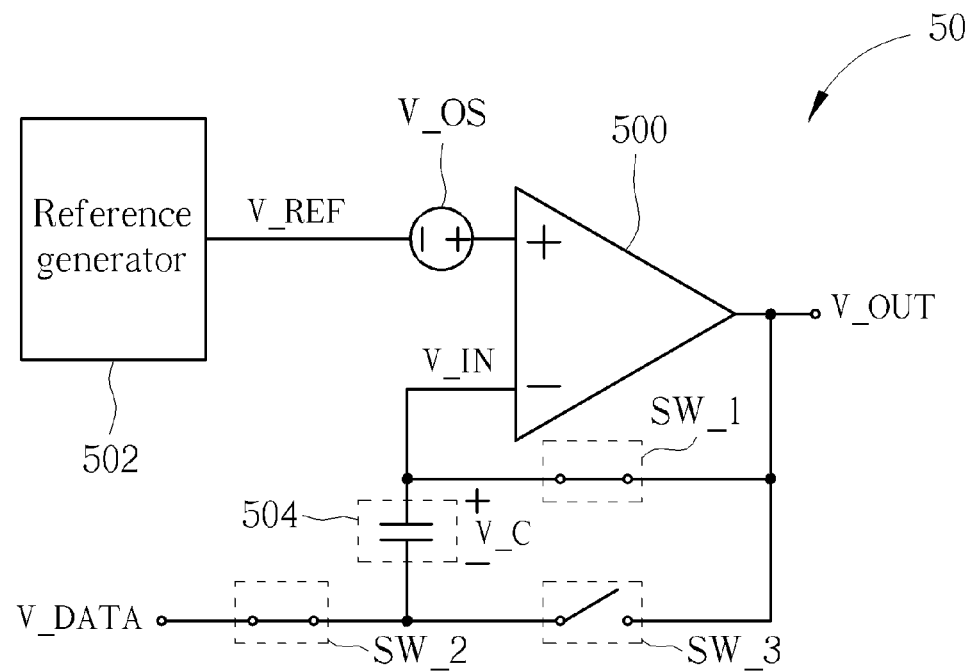
FIG. 5A and FIG. 5B are schematic diagrams of an output buffer according to an embodiment of the present invention.
Figure 5B:
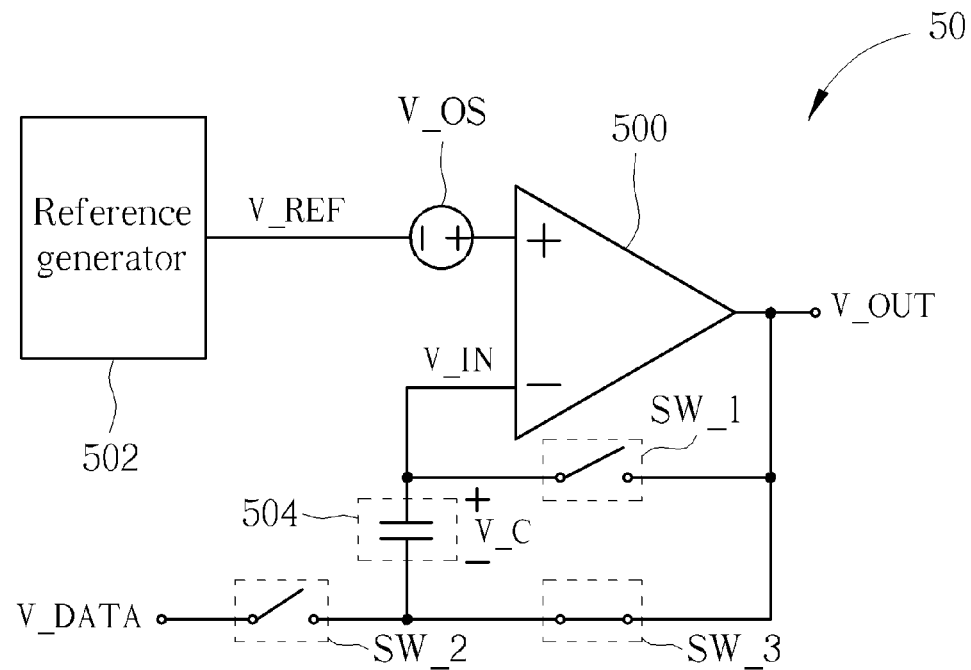

Please refer to FIG. 5A and FIG. 5B, which are schematic diagrams of an output buffer 50 according to an embodiment of the present invention. The structure of the output buffer 50 is similar to the structure of the output buffer 30; hence, signals with similar functions are denoted by the same symbols. Similar to the output buffer 30, the output buffer 50 also receives a data signal V_DATA from a data input terminal and outputs an output signal V_OUT to the LCD panel. As shown in FIGS. 5A and 5B, the output buffer 50 includes an op amp 500, a reference voltage generator 502, a sampling capacitor 504 and switches SW_1, SW_2 and SW_3. The op amp 500 is utilized for driving the output signal V_OUT of the output buffer 50 according to the data signal V_DATA from the data input terminal of the output buffer 50. The reference voltage generator 502, coupled to the positive input terminal of the op amp 500, is utilized for generating a reference voltage V_REF and inputting the reference voltage V_REF to the op amp 500. The sampling capacitor 504, coupled to the negative input terminal of the op amp 500, is utilized for cancelling the offset voltage V_OS between the two input terminals of the op amp 500. The offset voltage V_OS is illustrated as a voltage source coupled to the positive input terminal of the op amp 500, as similar to the case in the output buffer 30. Each of the switches SW_1, SW_2 and SW_3 in the output buffer 50 is also realized by a transmission gate. In addition, the timing allocation for the output buffer 50 is similar to the timing allocation for the output buffer 30; that is, the output buffer 50 is also operated in two phases: the sample phase and the output phase.

A difference between the output buffer 50 and the output buffer 30 is that the input terminal of the output buffer 30 receives the data signal V_DATA but the input terminal of the output buffer 50 receives the reference voltage V_REF. As mentioned above, the data signal V_DATA stands for the pixel data required to be displayed on the LCD, so that the data signal V_DATA may range from the ground voltage to the power supply voltage of the output buffer. Therefore, the rail-to-rail input structure is required in the op amp if the input terminal of the op amp receives the wide range data signal V_DATA. On the other hand, the reference voltage V_REF is a user-defined voltage having any voltage value, and may be a constant voltage. Preferably, the reference voltage V_REF may be substantially equal to a half of the power supply voltage of the output buffer 50. For example, if the power supply voltage of the output buffer 50 is 5V, the reference voltage V_REF may be determined to be a constant voltage having a value equal to 2.5V. Therefore, even if the data signal V_DATA may have any voltage value within 0V and 5V, the input voltage of the op amp 500 is substantially equal to 2.5V, so that the rail-to-rail input structure is not required in the op amp 500.

It should be noted that in the output buffer 50 shown in FIGS. 5A and 5B, the sample phase and the output phase are realized by controlling the switches SW_1, SW_2 and SW_3, where FIG. 5A illustrates the sample phase and FIG. 5B illustrates the output phase. In detail, as shown in FIGS. 5A and 5B, the switch SW_1 is coupled between the negative input terminal of the op amp 500 and the output terminal of the op amp 500. The switch SW_2 is coupled between the negative terminal of the sampling capacitor 504 and the data input terminal of the output buffer 50. The switch SW_3 is coupled between the negative terminal of the sampling capacitor 504 and the output terminal of the op amp 500 (i.e., the output terminal of the output buffer 50). As shown in FIG. 5A, in the sample phase, the switch SW_1 is closed to couple the negative input terminal of the op amp 500 with the output terminal of the op amp 500, the switch SW_2 is closed to couple the negative terminal of the sampling capacitor 504 with the data input terminal of the output buffer 50, and the switch SW_3 is open. As shown in FIG. 5B, in the output phase, the switch SW_1 is open, the switch SW_2 is open, and the switch SW_3 is closed to couple the negative terminal of the sampling capacitor 504 with the output terminal of the op amp 500.

In the sample phase, the sampling capacitor 504 is utilized for sampling the offset voltage V_OS, where the voltage difference between the data signal V_DATA and the reference voltage V_REF is incorporated. As shown in FIG. 5A (where the switches SW_1 and SW_2 are closed and the switch SW_3 is open), the output terminal of the op amp 500 is coupled to the negative input terminal of the op amp 500, and the output signal V_OUT may be calculated as follows:

$$V\_OUT = V\_REF + V\_OS \quad (1)$$

Since the sampling capacitor 504 is coupled between the negative input terminal of the op amp 500 and the data input terminal of the output buffer 50 in the sample phase, the sampled voltage V_C (i.e., the voltage difference between the positive and negative terminals of the sampling capacitor 504) sampled by the sampling capacitor 504 may be calculated as follows:

$$V\_C = V\_OUT - V\_DATA \quad (2)$$

where V_OUT can be substituted by Equation (1) to obtain:

$$V\_C = V\_REF + V\_OS - V\_DATA \quad (3)$$

Please note that, in the sample phase, the output signal V_OUT of the output buffer 50 may output the reference voltage V_REF with the offset voltage V_OS incorporated.

In the output phase, the offset voltage V_OS may be cancelled. The output buffer 50 may output the data signal V_DATA for the pixel data required to be displayed. In detail, the sampled voltage V_C has been stored in the sampling capacitor 504 and may remain in the output phase, so that the value of V_C in the output phase can be obtained from Equation (3). As shown in FIG. 5B, (where the switches SW_1 and SW_2 are open and the switch SW_3 is closed), in consideration of the offset voltage V_OS, the negative input signal V_IN obtained in the negative input terminal of the op amp 500 may be calculated as follows:

$$V\_IN = V\_REF + V\_OS \quad (4)$$

Since the sampling capacitor 504 is coupled between the negative input terminal of the op amp 500 and the output terminal of the op amp 500 (i.e., the output terminal of the output buffer 50), the output signal V_OUT may be calculated by:

$$V\_OUT = V\_IN - V\_C \quad (5)$$

where V_IN can be substituted by Equation (4) and V_C can be substituted by Equation (3) to obtain:

$$V\_OUT = (V\_REF + V\_OS) - (V\_REF + V\_OS - V\_DATA) \quad (6)$$

Equation (6) can therefore be simplified to be:

$$V\_OUT = V\_DATA \quad (7)$$

In the output phase, the influence of the reference voltage V_REF and the offset voltage V_OS is eliminated. The output signal V_OUT of the output buffer 50 may output the data signal V_DATA where the offset voltage V_OS is cancelled.

Please note that the input terminal of the op amp 500 receives the reference voltage V_REF both in the sample phase and the output phase, where the reference voltage V_REF may be a constant voltage. The value of the offset voltage V_OS between the input terminals of the op amp 500 is quite small and may be omitted. Since the op amp 500 receives the reference voltage V_REF instead of the data signal V_DATA, the op amp 500 does not need to be adapted to a wide range of voltage (such as the data signal V_DATA); hence, the rail-to-rail input structure will not be required in the op amp 500; this simplifies the structure of the op amp 500 and reduces the transistor count required in the op amp 500. More specifically, the op amp 500 may have only one input stage with only one differential pair for receiving the user-defined reference voltage V_REF, while the op amp 300 requires two differential pairs (one PMOS differential pair and one NMOS differential pair) for rail-to-rail input function. Detailed structure of the op amp 500 will be narrated hereinafter.

Figure 6:
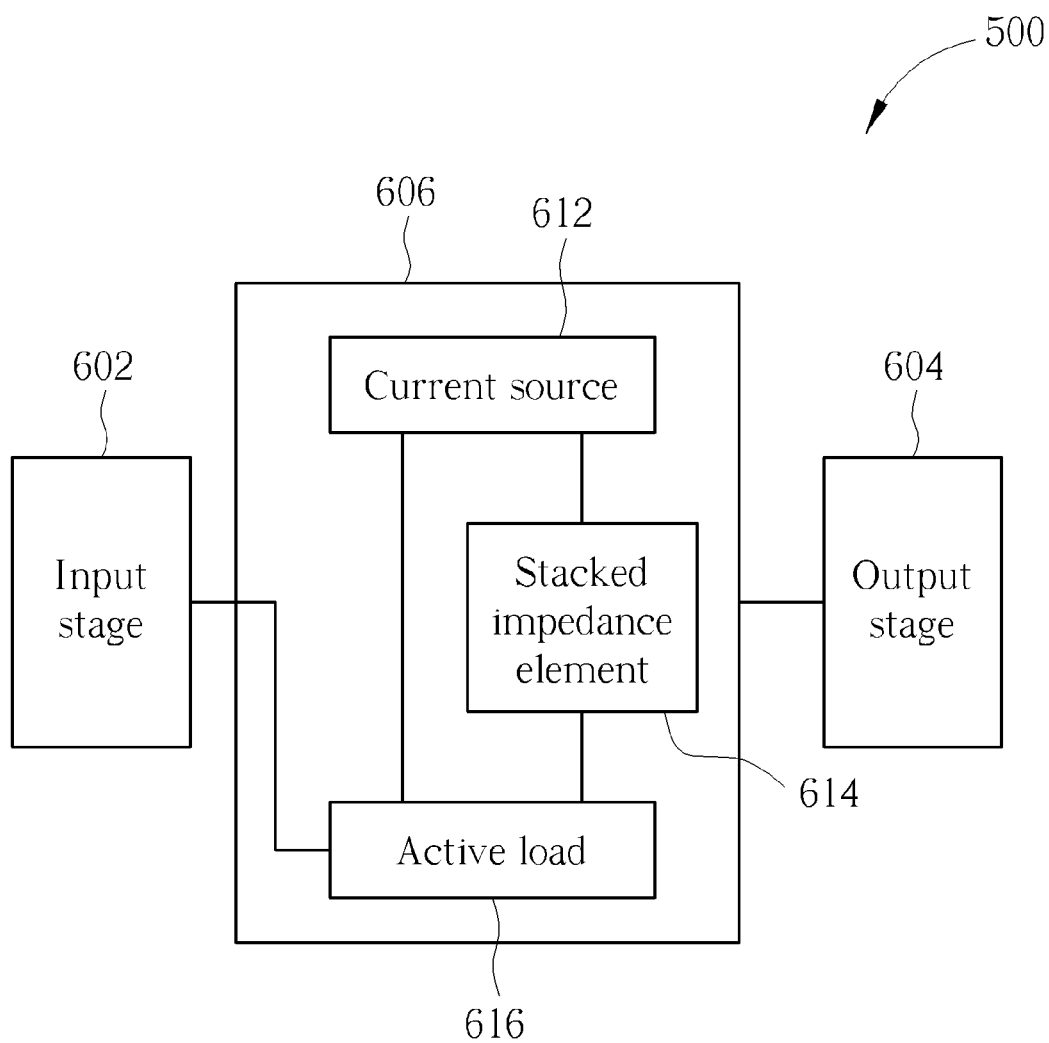
FIG. 6 is a schematic diagram of an implementation of the operational amplifier shown in FIGS. 5A and 5B.

Please refer to FIG. 6, which is a schematic diagram of an implementation of the op amp 500. As shown in FIG. 6, the op amp 500 includes only one input stage 602, an output stage 604 and an active load stage. The input stage 602 is utilized for receiving the input signal of the op amp 500, e.g., the reference voltage V_REF. The output stage 604 is utilized for outputting the output signal V_OUT and driving the pixel units on the LCD panel. The output stage 604 may include a high-side transistor and a low-side transistor where the common drain terminal of the high-side transistor and the low-side transistor is the output terminal of the op amp 500. The active load stage, coupled between the input stage 602 and the output stage 604, includes a current source 612, a stacked impedance element 614 and an active load 616.

The current source 612 is utilized for generating the current flowing in the active load stage 606, i.e., the current flowing through the stacked impedance element 614 and the active load 616. The stacked impedance element 614, coupled between the gate terminals of the high-side transistor and the low-side transistor in the output stage 604, is utilized for providing impedance between the gate terminal of the high-side transistor and the gate terminal of the low-side transistor. The stacked impedance element 614 may include at least one transistor or resistor, or any other load element for generating impedance, which is not limited herein. The active load 616, coupled to the current source 612, is utilized for receiving the current generated by the current source 612.

Figure 7:
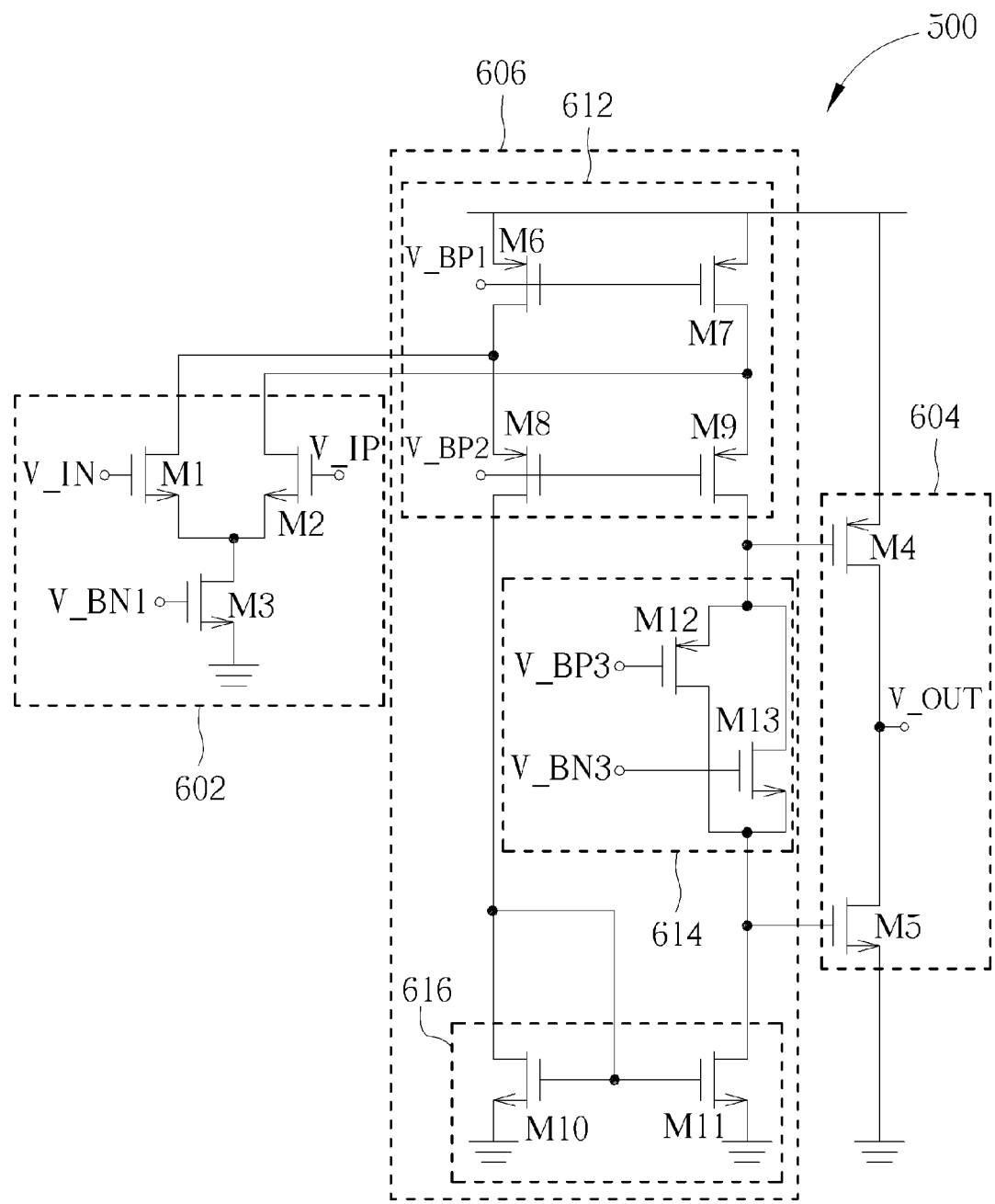
FIG. 7 is a schematic diagram of a detailed structure of the operational amplifier.

Please refer to FIG. 7, which is a schematic diagram of a detailed structure of the op amp 500. FIG. 7 illustrates a MOS-level structure corresponding to the block-level structure shown in FIG. 6. As shown in FIG. 7, the input stage 602 includes a differential pair of NMOS transistors M1, M2 and a current source transistor M3. The gate terminals of the NMOS transistors M1, M2 respectively receive input signals V_IN and V_IP and may be regarded as the negative and positive input terminals of the op amp 500, respectively, where the input signals V_IP and V_IN may be substantially equal to the reference voltage V_REF (where the offset voltage V_OS is quite small). The current source transistor M3, coupled to the common source terminal of the NMOS transistors M1 and M2, is utilized for generating a current flowing in the input stage 602. The current source transistor M3 receives a bias voltage V_BN1 and thereby determines the current flowing through the differential pair. Note that the reference voltage V_REF received by the input stage 602 is a constant voltage, so there is only one input stage 602 in the op amp 500 and the input stage 602 has only one differential pair. In contrast to the op amp 300 of the auto-zero offset cancellation circuit wherein the rail-to-rail input structure requires deployment of both the PMOS differential pair and NMOS differential pair, the op amp 500 of the present invention requires only one differential pair (which may be an NMOS differential pair or a PMOS differential pair) to receive the constant reference voltage V_REF. In FIG. 7, in order to enable the NMOS differential pair, the reference voltage V_REF should be greater than the threshold voltage of the NMOS transistors M1 and M2 plus the drain-source voltage of the current source transistor M3. For example, if the power supply voltage of the op amp 500 is 5V, the threshold voltage of the NMOS transistors M1 and M2 is 0.7V, and the drain-source voltage of the current source transistor M3 is 0.3V, the reference voltage V_REF should be greater than 1V. As mentioned above, the reference voltage V_REF is preferably equal to a half of the power supply voltage, i.e., 2.5V, to gain a higher overdrive voltage for the NMOS differential pair, in order to achieve higher gain and higher slew rate for the op amp 500.

Please keep referring to FIG. 7. The output stage 604 includes a high-side PMOS transistor M4 and a low-side NMOS transistor M5. The common drain terminal of the transistors M4 and M5 is the output terminal of the op amp 500 for outputting the output signal V_OUT. Since the output signal V_OUT may be any voltage for driving the pixel units with any possible brightness or gray scale. The output stage 604 should possess the rail-to-rail structure and should be able to output the output signal V_OUT ranging from the ground voltage to the power supply voltage. In the active load stage 606, the current source 612 includes PMOS transistors M6, M7, M8 and M9. The PMOS transistors M6 and M7 receive a bias voltage V_BP1, and the PMOS transistors M8 and M9 receive a bias voltage V_BP2, in order to determine the current flowing in the active load stage 606. The active load 616 includes NMOS transistors M10 and M11, which are utilized for sinking the current generated by the PMOS transistors M6-M9.

In addition, the stacked impedance element 614 includes a PMOS transistor M12 and an NMOS transistor M13, where the PMOS transistor M12 receives a bias voltage V_BP3 and the NMOS transistor M13 receives a bias voltage V_BN3. The transistors M12 and M13 generate equivalent impedance between the gate voltages of the transistors M4 and M5. Note that the stacked impedance element 614 may aim at pushing the gate voltage of the transistor M4 to a higher level to turn off the transistor M4 when the op amp 500 needs to output an extremely low voltage, e.g., approximate 0V, or aim at pushing the gate voltage of the transistor M5 to a lower level to turn off the transistor M5 when the op amp 500 needs to output an extremely high voltage, e.g., approximate 5V.

According to the implementation of MOS transistors shown in FIG. 7, the op amp 500 has 13 transistors. In consideration of 13 transistors in the op amp 500 and 6 transistors for the switches SW_1, SW_2 and SW_3 in the output buffer 50, the output buffer 50 totally requires 19 transistors. As mentioned above, the sampling capacitor 504 may be implemented with the MIM capacitor without occupying circuit areas in the diffusion and poly layers. As a result, the circuit structure of the op amp 500 may achieve more reduction of transistor count than the conventional auto-zero offset cancellation technique, and thereby save more circuit areas, while the offset cancellation capability still remains.

Please note that the present invention provides an output buffer and an offset cancellation method for an LCD source driver, wherein the output buffer and offset cancellation method are capable of omitting the usage of rail-to-rail input structure in the operational amplifier, in order to save circuit area while the offset cancellation capability still remains. Those skilled in the art may make modifications and alternations accordingly. For example, the structure of the op amp 500 shown in FIG. 7 may be modified according to system requirements. One example is that the transistors M12 and M13 may be replaced by resistors or other load elements capable of providing impedance between the gate terminals of the transistors M4 and M5. In another embodiment, a compensation capacitor may be included in the output stage 604 to enhance the stability of the op amp 500. Furthermore, the roles of the positive and negative input terminals of the op amp 500 are not limited herein. For example, the reference voltage V_REF may be inputted to the negative input terminal and the sampling capacitor 504 samples the offset voltage V_OS in the positive input terminal. In other words, the roles of the positive and negative input terminals may be interchanged. Note that the roles of the positive and negative terminals of the sampling capacitor 504 may also be interchanged.

In an embodiment, the input stage may apply a PMOS differential pair instead of the NMOS differential pair shown in FIG. 7, where other circuit elements in the op amp are modified correspondingly, as described in the following paragraphs.

Figure 8:
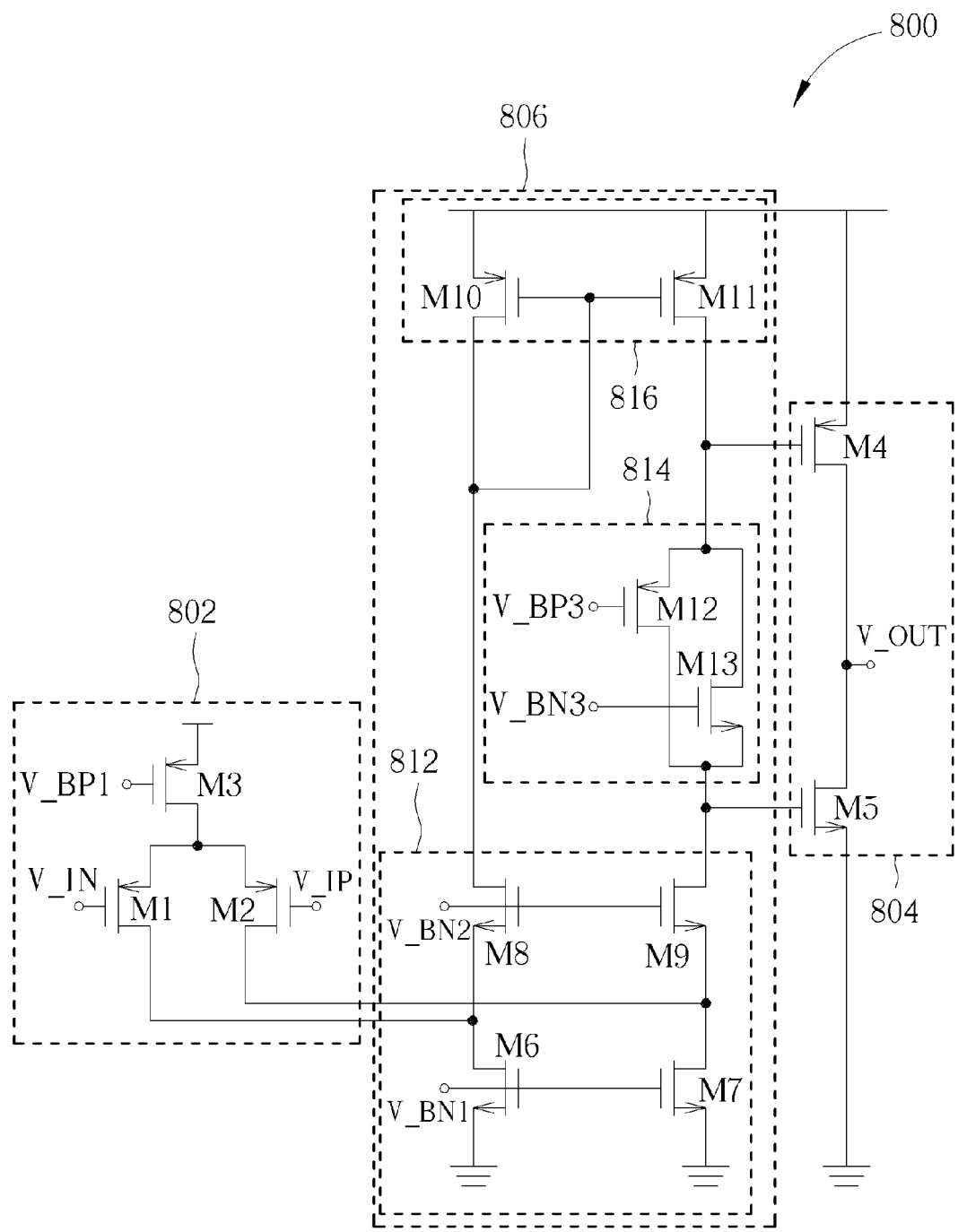
FIG. 8 is a schematic diagram of a detailed structure of another operational amplifier.

Please refer to FIG. 8, which is a schematic diagram of a detailed structure of another op amp 800. The op amp 800 shown in FIG. 8 is similar to the op amp 500 shown in FIG. 7; hence, circuit elements or signals with similar functions are denoted by the same symbols. The main difference between the op amp 800 and the op amp 500 is that the op amp 800 applies a PMOS differential pair in its input stage while the op amp 500 applies an NMOS differential pair in its input stage. In other words, the op amp 800 may be a counterpart of the op amp 500. As shown in FIG. 8, the op amp 800 includes an input stage 802, an output stage 804 and an active load stage 806. The active load stage 806 further includes a current source 812, a stacked impedance element 814 and an active load 816.

In detail, the input stage 802 includes a differential pair of PMOS transistors M1, M2 and a current source transistor M3. The gate terminals of the PMOS transistors M1, M2 respectively receive input signals V_IN and V_IP and may be regarded as the negative and positive input terminals of the op amp 800, respectively, where the input signals V_IP and V_IN may be substantially equal to the reference voltage V_REF (where the offset voltage V_OS is quite small). The current source transistor M3, coupled to the common source terminal of the PMOS transistors M1 and M2, is utilized for determining a current flowing in the input stage 802. The current source transistor M3 receives a bias voltage V_BP1 and thereby determines the current flowing through the differential pair. Note that the reference voltage V_REF received by the input stage 802 is a constant voltage, so there is only one input stage 802 in the op amp 800 and the input stage 802 has only one differential pair. In this embodiment, the only one differential pair included in the input stage 802 is a PMOS differential pair. In order to enable the PMOS differential pair, the reference voltage V_REF should be smaller than the power supply voltage plus the threshold voltage of the PMOS transistors M1 and M2 and further plus the drain-source voltage of the current source transistor M3. For example, if the power supply voltage of the op amp 800 is 5V, the threshold voltage of the PMOS transistors M1 and M2 is −0.7V, and the drain-source voltage of the current source transistor M3 is −0.3V, the reference voltage V_REF should be smaller than 4V. As mentioned above, the reference voltage V_REF is preferably equal to a half of the power supply voltage, i.e., 2.5V, to gain a higher overdrive voltage for the PMOS differential pair, in order to achieve higher gain and higher slew rate for the op amp 800.

Please keep referring to FIG. 8. The output stage 804 includes a high-side PMOS transistor M4 and a low-side NMOS transistor M5. Detailed descriptions related to the transistors M4 and M5 are similar to the case in FIG. 7, and will not be narrated herein. In the active load stage 806, the current source 812 includes NMOS transistors M6, M7, M8 and M9. The NMOS transistors M6 and M7 receive a bias voltage V_BN1, and the NMOS transistors M8 and M9 receive a bias voltage V_BN2, in order to determine the current flowing in the active load stage 806. The active load 816 includes PMOS transistors M10 and M11, which are utilized for sourcing the current generated by the NMOS transistors M6-M9. In addition, the structure of the stacked impedance element 814 is the same as the structure of the stacked impedance element 614 shown in FIG. 7; hence, the detailed structure of the stacked impedance element 814 and related operations can be obtained in the above paragraphs, and will not be narrated herein.

According to the implementation of MOS transistors shown in FIG. 8, the op amp 800 also has 13 transistors. If the op amp 800 is applied in the output buffer 50, the output buffer 50 totally requires 19 transistors, which includes 13 transistors in the op amp 800 and 6 transistors for the switches SW_1, SW_2 and SW_3. As mentioned above, the sampling capacitor 504 may be implemented with the MIM capacitor without occupying circuit areas in the diffusion and poly layers. As a result, the circuit structure of the op amp 800 shown in FIG. 8 may also achieve more reduction of transistor count than the conventional auto-zero offset cancellation technique, and thereby save more circuit areas, while the offset cancellation capability still remains.

Figure 9:
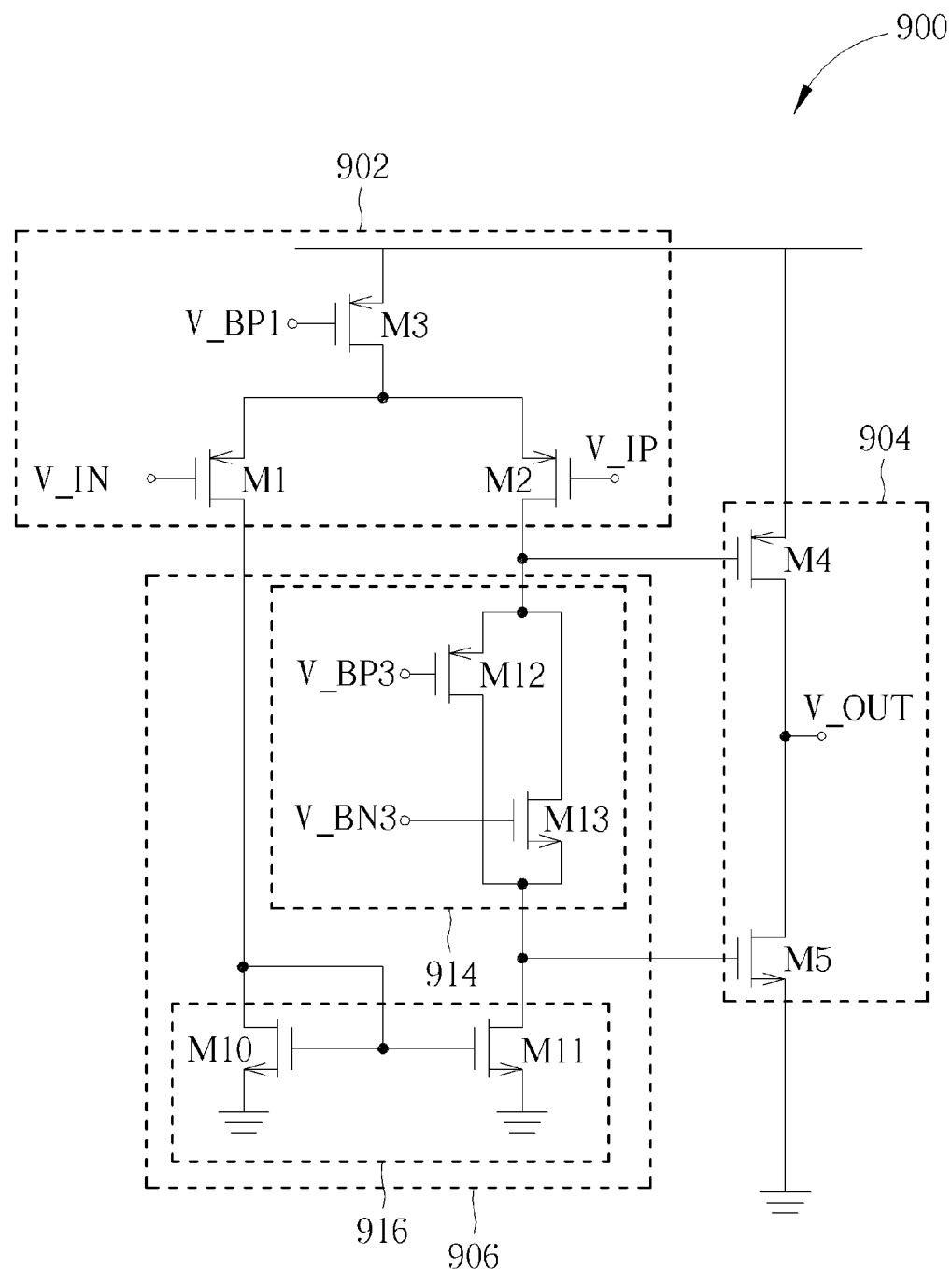
FIG. 9 is a schematic diagram of a detailed structure of another operational amplifier.

Please note that, in the above embodiments, the input stage of the op amps 500 and 800 are implemented with folded cascode structure, which may have better performance such as higher gain and higher output driving capability. In other embodiments, the structure of op amp may further be simplified to save more circuit areas while enough performance may still obtained. Please refer to FIG. 9, which is a schematic diagram of a detailed structure of another op amp 900. The op amp 900 shown in FIG. 9 is similar to the op amp 500 and the op amp 800; hence, circuit elements or signals with similar functions are denoted by the same symbols. The main difference between the op amp 900 and the op amps 500, 800 is that the op amp 900 does not use the folded cascode structure. The op amp 900 applies a more simplified structure and thereby uses fewer transistors. As shown in FIG. 9, the op amp 900 includes an input stage 902, an output stage 904 and an active load stage 906. The active load stage 906 further includes a stacked impedance element 914 and an active load 916.

In detail, the input stage 902 includes a differential pair of PMOS transistors M1, M2 and a current source transistor M3. The gate terminals of the PMOS transistors M1, M2 respectively receive input signals V_IN and V_IP and may be regarded as the negative and positive input terminals of the op amp 900, respectively, where the input signals V_IP and V_IN may be substantially equal to the reference voltage V_REF (where the offset voltage V_OS is quite small). The current source transistor M3, coupled to the common source terminal of the PMOS transistors M1 and M2, is utilized for determining a current flowing in the input stage 902. The current source transistor M3 receives a bias voltage V_BP1 and thereby determines the current flowing through the differential pair. Note that the reference voltage V_REF received by the input stage 902 is a constant voltage, so there is only one input stage 902 in the op amp 900 and the input stage 902 has only one differential pair. The output stage 904 includes a high-side PMOS transistor M4 and a low-side NMOS transistor M5. Detailed descriptions and operations related to the transistors M4 and M5 are similar to the case in FIGS. 7 and 8, and will not be narrated herein.

In this embodiment, the structure of the input stage 902 is similar to the structure of the input stage 802, except that the PMOS differential pair in the input stage 902 is cascaded to the active load stage 906 instead of applying the folded cascode structure. Therefore, the upper limit of the reference voltage V_REF inputted to the input stage 902 can be obtained from the above descriptions related to the input stage 802; that is, the power supply voltage plus the threshold voltage of the differential pair of transistors M1 and M2 and further plus the drain-source voltage of the current source transistor M3. Note that, in this embodiment, the reference voltage V_REF is preferably higher than a half of the power supply voltage, in order to allow the gate voltage of the PMOS transistor M4 to reach a higher level to turn off the PMOS transistor M4 when the op amp 900 needs to output an extremely low voltage.

Please keep referring to FIG. 9. The structure of the stacked impedance element 914 is the same as the structure of the stacked impedance elements 614 and 814; hence, the detailed structure of the stacked impedance element 914 and related operations can be obtained in the above paragraphs, and will not be narrated herein. The active load 916 includes NMOS transistors M10 and M11, which are utilized for sinking the current generated by the current source transistor M3. Note that the input stage 902 is cascaded to the active load stage 906, so the current source transistor M3 may supply currents to both of the input stage 902 and the active load stage 906. In such a condition, the current source transistors M6-M9 in the FIGS. 7 and 8 may be omitted.

According to the implementation of MOS transistors shown in FIG. 9, the op amp 900 only has 9 transistors. If the op amp 900 is applied in the output buffer 50, the output buffer 50 totally requires 15 transistors, which includes 9 transistors in the op amp 900 and 6 transistors for the switches SW_1, SW_2 and SW_3. As mentioned above, the sampling capacitor 504 may be implemented with the MIM capacitor without occupying circuit areas in the diffusion and poly layers. As a result, the circuit structure of the op amp 900 shown in FIG. 9 may achieve much more reduction of transistor count than the conventional auto-zero offset cancellation technique and the abovementioned offset cancellation method with structures of the op amps 700 and 800, and thereby save much more circuit areas, while the offset cancellation capability still remains.

Figure 10:
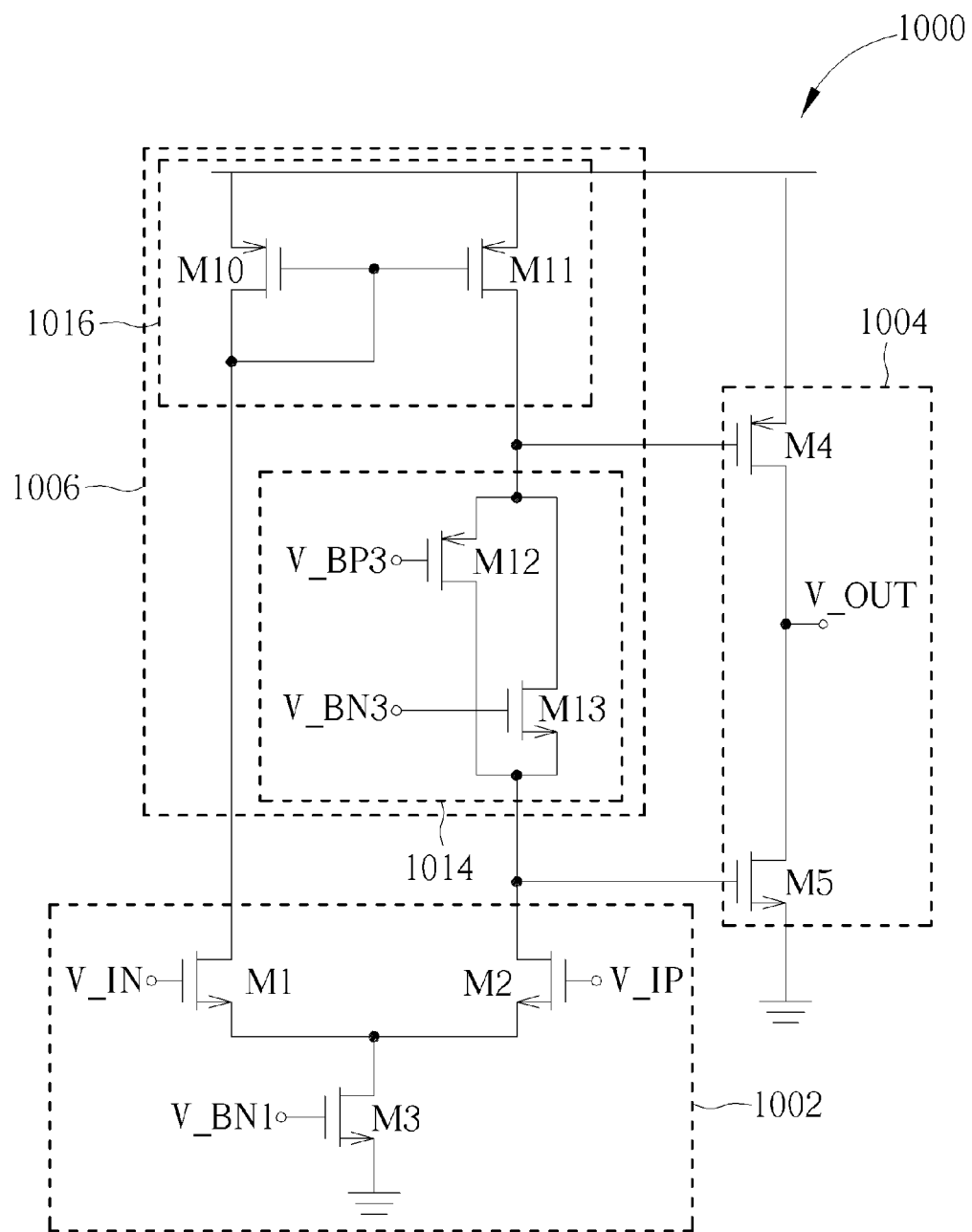
FIG. 10 is a schematic diagram of a detailed structure of another operational amplifier.

Please refer to FIG. 10, which is a schematic diagram of a detailed structure of another op amp 1000. The op amp 1000 shown in FIG. 10 is similar to the op amp 900; hence, circuit elements or signals with similar functions are denoted by the same symbols. The main difference between the op amp 1000 and the op amp 900 is that the op amp 1000 applies an NMOS differential pair in its input stage while the op amp 900 applies a PMOS differential pair in its input stage. In other words, the op amp 1000 may be a counterpart of the op amp 900. As shown in FIG. 10, the op amp 1000 includes an input stage 1002, an output stage 1004 and an active load stage 1006. The active load stage 1006 further includes a stacked impedance element 1014 and an active load 1016.

In detail, the input stage 1002 includes a differential pair of NMOS transistors M1, M2 and a current source transistor M3. The gate terminals of the NMOS transistors M1, M2 respectively receive input signals V_IN and V_IP and may be regarded as the negative and positive input terminals of the op amp 1000, respectively, where the input signals V_IP and V_IN may be substantially equal to the reference voltage V_REF (where the offset voltage V_OS is quite small). The current source transistor M3, coupled to the common source terminal of the NMOS transistors M1 and M2, is utilized for determining a current flowing in the input stage 1002. The current source transistor M3 receives a bias voltage V_BN1 and thereby determines the current flowing through the differential pair. Note that the reference voltage V_REF received by the input stage 1002 is a constant voltage, so there is only one input stage 1002 in the op amp 1000 and the input stage 1002 has only one differential pair. The output stage 1004 includes a high-side PMOS transistor M4 and a low-side NMOS transistor M5. Detailed descriptions and operations related to the transistors M4 and M5 are similar to the case in FIGS. 7-9, and will not be narrated herein.

In this embodiment, the structure of the input stage 1002 is similar to the structure of the input stage 602, except that the NMOS differential pair in the input stage 1002 is cascaded to the active load stage 1006 instead of applying the folded cascode structure. Therefore, the lower limit of the reference voltage V_REF inputted to the input stage 1002 can be obtained from the above descriptions related to the input stage 602; that is, the threshold voltage of the differential pair of NMOS transistors M1 and M2 plus the drain-source voltage of the current source transistor M3. Note that, in this embodiment, the reference voltage V_REF is preferably lower than a half of the power supply voltage, in order to allow the gate voltage of the NMOS transistor M5 to reach a lower level to turn off the NMOS transistor M5 when the op amp 1000 needs to output an extremely high voltage.

Please keep referring to FIG. 10. The structure of the stacked impedance element 1014 is the same as the structure of the stacked impedance elements 614, 814 and 914; hence, the detailed structure of the stacked impedance element 1014 and related operations can be obtained in the above paragraphs, and will not be narrated herein. The active load 1016 includes PMOS transistors M10 and M11, which are utilized for sourcing the current generated by the current source transistor M3. Note that the input stage 1002 is cascaded to the active load stage 1006, so the current source transistor M3 may supply currents to both of the input stage 1002 and the active load stage 1006. In such a condition, the transistor count in the op amp 1000 will be the same as the transistor count in the op amp 900, so that the significant reduction of transistor count may also be achieved in the op amp 1000.

According to the implementation of MOS transistors shown in FIG. 10, the op amp 1000 only has 9 transistors. If the op amp 1000 is applied in the output buffer 50, the output buffer 50 totally requires 15 transistors, which includes 9 transistors in the op amp 1000 and 6 transistors for the switches SW_1, SW_2 and SW_3. As mentioned above, the sampling capacitor 504 may be implemented with the MIM capacitor without occupying circuit areas in the diffusion and poly layers. As a result, the circuit structure of the op amp 1000 shown in FIG. 10 may achieve much more reduction of transistor count than the conventional auto-zero offset cancellation technique and the abovementioned offset cancellation method with structures of the op amps 700 and 800, and thereby save much more circuit areas, while the offset cancellation capability still remains.

Figure 11:
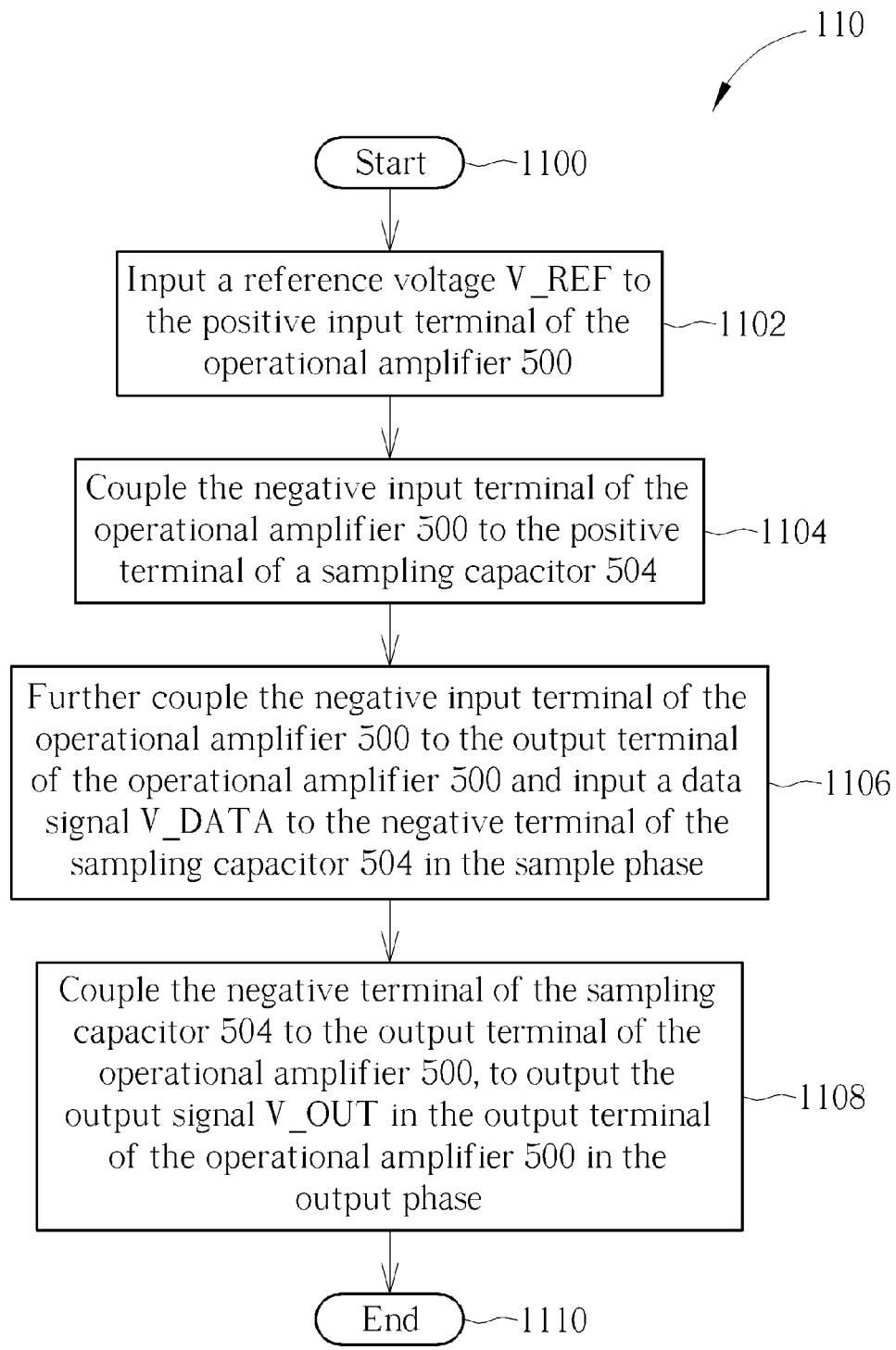
FIG. 11 is a schematic diagram of an offset cancellation process according to an embodiment of the present invention.

The abovementioned operation of the output buffer 50 can be summarized into an offset cancellation process 110, as shown in FIG. 11. The offset cancellation process 110 includes the following steps:

Step 1100: Start.

Step 1102: Input a reference voltage V_REF to the positive input terminal of the operational amplifier 500.

Step 1104: Couple the negative input terminal of the operational amplifier 500 to the positive terminal of a sampling capacitor 504.

Step 1106: Further couple the negative input terminal of the operational amplifier 500 to the output terminal of the operational amplifier 500 and input a data signal V_DATA to the negative terminal of the sampling capacitor 504 in the sample phase.

Step 1108: Couple the negative terminal of the sampling capacitor 504 to the output terminal of the operational amplifier 500, to output the output signal V_OUT in the output terminal of the operational amplifier 500 in the output phase.

Step 1110: End.

The detailed operations and alternations of the offset cancellation process 110 are illustrated in the above description, and will not be narrated hereinafter.

To sum up, the present invention discloses an offset cancellation structure and an offset cancellation method for an LCD source driver. In contrast to the conventional chopper or auto-zero offset cancellation techniques which require higher transistor count, the embodiments of the present invention apply the reference voltage to the input terminal of the op amp of the output buffer, in order to omit the usage of rail-to-rail input structure in the op amp. Therefore, the transistor count in the output buffer of the LCD source driver may be significantly reduced, while the offset cancellation capability still remains. Further, the range of the output signal may still extend from the ground voltage to the power supply voltage of the output buffer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output buffer with an offset cancellation structure, for a liquid crystal display (LCD) source driver, comprising:
    an operational amplifier, for driving an output signal of the output buffer according to a data signal from a data input terminal of the output buffer;
    a reference voltage generator, coupled to a first input terminal of the operational amplifier, for generating a reference voltage and inputting the reference voltage to the operational amplifier; and
    a sampling capacitor, coupled between a second input terminal of the operational amplifier and the data input terminal of the output buffer in a first phase, and coupled between the second input terminal of the operational amplifier and an output terminal of the operational amplifier in a second phase, wherein the second input terminal of the operational amplifier is further coupled to the output terminal of the operational amplifier in the first phase;
    wherein the output signal outputs the reference voltage with an offset voltage in the first phase and outputs the data signal where the offset voltage is cancelled in the second phase.

2. The output buffer of claim 1, further comprising:
    a first switch, coupled between the second input terminal of the operational amplifier and the output terminal of the operational amplifier, wherein the first switch is closed to couple the second input terminal of the operational amplifier with the output terminal of the operational amplifier in the first phase and open in the second phase;
    a second switch, coupled between the sampling capacitor and the data input terminal of the output buffer, wherein the second switch is closed to couple the sampling capacitor with the data input terminal of the output buffer in the first phase and open in the second phase; and
    a third switch, coupled between the sampling capacitor and the output terminal of the operational amplifier, wherein the third switch is closed to couple the sampling capacitor with the output terminal of the operational amplifier in the second phase and open in the first phase.

3. The output buffer of claim 2, wherein each of the first switch, the second switch and the third switch is a transmission gate.

4. The output buffer of claim 1, wherein the operational amplifier comprises:
    an input stage, comprising:
        an differential pair of transistors, gate terminals of which are the negative and positive input terminals of the operational amplifier; and
        a first current source, coupled to a common source terminal of the differential pair, for generating a first current flowing in the input stage;
    an output stage, comprising a high-side transistor and a low-side transistor, wherein a common drain terminal of the high-side transistor and the low-side transistor is the output terminal of the operational amplifier; and
    an active load stage, coupled between the input stage and the output stage.

5. The output buffer of claim 4, wherein the active load stage comprises:
    a stacked impedance element, coupled between gate terminals of the high-side transistor and the low-side transistor in the output stage, for providing an impedance between the gate terminal of the high-side transistor and the gate terminal of the low-side transistor.

6. The output buffer of claim 4, wherein the active load stage further comprises:
    an active load, coupled to the input stage, for sinking or sourcing the first current generated by the first current source.

7. The output buffer of claim 6, wherein the active load stage further comprises:
    a second current source, for generating a second current flowing in the active load stage;
    wherein the active load further sinks or sources the second current generated by the second current source.

8. The output buffer of claim 1, wherein the data signal ranges from a ground voltage to a power supply voltage of the output buffer.

9. The output buffer of claim 1, wherein the reference voltage is a constant voltage.

10. The output buffer of claim 1, wherein the reference voltage is substantially equal to a half of a power supply voltage of the output buffer.

11. The output buffer of claim 1, wherein the operational amplifier does not have a rail-to-rail input structure.

12. An offset cancellation method, for a liquid crystal display (LCD) source driver, comprising:
- inputting a reference voltage to a first input terminal of the operational amplifier;
- coupling a second input terminal of the operational amplifier to a first terminal of a sampling capacitor;
- in a first phase, further coupling the second input terminal of the operational amplifier to an output terminal of the operational amplifier and inputting a data signal to a second terminal of the sampling capacitor; and
- in a second phase, coupling the second terminal of the sampling capacitor to the output terminal of the operational amplifier, to output an output signal in the output terminal of the operational amplifier.

* * * * *